United States Patent [19]

Walsh et al.

[11] Patent Number: 5,101,161
[45] Date of Patent: Mar. 31, 1992

[54] NON-DESTRUCTIVE STATUS DETERMINATION FOR ELECTRIC POWER CABLES

[75] Inventors: Thomas D. Walsh, Braintree; Nicholas Reinhardt, Lexington; James M. Feldman, Newton Highlands; George R. Vrablik, Wayland; Joshua Horwitz, Magnolia; Kathleen M. Morris, Wakefield; John O. Rudy, Newton, all of Mass.

[73] Assignee: Boston Edison Company, Boston, Mass.

[21] Appl. No.: 598,859

[22] Filed: Oct. 12, 1990

[51] Int. Cl.5 ............................................. G01R 31/00
[52] U.S. Cl. ................................... 324/543; 324/508; 324/539; 324/149; 324/66; 324/72.5
[58] Field of Search ............... 324/508, 539, 543, 66, 324/72.5, 149

[56] References Cited

U.S. PATENT DOCUMENTS

| | | | |
|---|---|---|---|
| 2,408,045 | 9/1946 | Cottrell | 324/539 X |
| 2,516,609 | 7/1950 | Woodard | 219/19 |
| 2,653,296 | 9/1953 | Weaver | 324/539 |
| 2,714,196 | 7/1955 | Melehan | 339/97 |
| 3,164,716 | 1/1965 | Schenker et al. | 219/383 |
| 3,363,171 | 1/1968 | Sietmann et al. | 324/51 |
| 3,390,331 | 6/1968 | Brown et al. | 324/122 |
| 3,564,403 | 2/1971 | Schwarz | 324/543 |
| 3,576,493 | 4/1971 | Tachick | 324/133 |
| 3,864,629 | 2/1975 | Danna | 324/72.5 |
| 4,760,327 | 7/1988 | Walsh et al. | 324/66 |
| 4,922,183 | 5/1990 | Kamas | 324/539 X |

*Primary Examiner*—Kenneth A. Wieder
*Assistant Examiner*—Glenn W. Brown
*Attorney, Agent, or Firm*—Kenway & Crowley

[57] ABSTRACT

Method and apparatus for identifying and determining the energization status of a cable having a conductive neutral member and an internal resistive screen layer involving probes radially movable relative to the cable to contact the neutral member and the internal resistive screen. Narrow-band AC signals and resistance measurements are utilized for self-testing and for cable testing. A microprocessor controls probe-heating in the advancing of probes through plastic sheath to reach the neutral wire and resistive screen layer. Resistance measurements made under control of the microprocessor are monitored with probe advance. Oscillators provide two signals of different frequencies, one of which is that of the power being transmitted through the cable, to provide distinctive signals indicative of cable energization status.

12 Claims, 4 Drawing Sheets

NON-DESTRUCTIVE STATUS DETERMINATION FOR ELECTRIC POWER CABLES

This invention relates in general to the reliable termination of the energization state of an electric power cable, and more particularly to apparatus and a self-adapting electronic test method for cable having neutral shielding and grading layers of a wide range of resistivity.

BACKGROUND OF THE INVENTION

Cables with concentric, coaxial ground-returns and high-resistivity grading layers are by far the preferred means of underground power distribution at primary voltage in North America. Often, when it is necessary to open such a cable between endpoints for purposes of splicing or testing, that cable may be one among several identical sets of cables at the site of operations. Positive identification of the correct set of cables is difficult, and even after identification, one cannot ascertain from the safe exterior of the cable whether it is live or dead. Mistakes in attempts at identification or in determining the cable status can be costly and dangerous; at best they leave a cable in need of repair and at worst they represent a considerable hazard to personnel. To avoid such hazards, methods have been developed to get "inside" the cable without subjecting the maintenance personnel to undue risk, but these methods are either lengthy (slow and meticulous peeling back of the several layers of sheath and conductor to reach the primary insulation) or potentially destructive of equipment and service (chopping the cable from a safe distance using a remote cable cutter). Often such work has to be done under difficult conditions of weather or in the wet and claustrophobic interior of a manhole. Speed, ease of use and reliability of equipment for the work are all critically important because they both lower cost and increase safety.

The same problems of identification and determination of status were encountered with the lead-sheathed cable which is still used in older urban underground distribution systems. Solutions to those problems are disclosed in U.S. Pat. No. 4,760,327, which is assigned to the assignee of this application. A small, easily repaired hole was formed by removing a plug of lead from the sheath to expose the grading or screen layer. Then, two probes were placed in contact with the high-resistivity grading or screen layer and the sheath, respectively. The line-frequency voltage drop caused by the flow of displacement current from the screen layer to the lead sheath was then observed to determine whether the cable was live or dead. These solutions were adequate but left room for improvement, especially in the area of detection of signals against a background of noise which is often quite high.

In addition to the improvement of methods associated with lead-sheathed cable, the need for accurate status determination in plastic-sheathed, concentric-wire-shield cable was also recognized. The principal variations in the lead cable are diameter and the resistivity of the screen layer. The sheet resistances of the screen layers vary by several orders of magnitude among cables of generally identical specification, while the lead thickness is reasonably constant over cables of very different ampacity. Concentric-wire-shield cables from different manufacturers show considerably more variation, with no agreement on the handedness of the helical shield, on the number or size of the shield wires therein, nor even on whether the wires should be regularly spaced or wound rather randomly onto the cable. These cables also show the same high variability in the screen-layer resistivity as the lead-sheathed cable. As noted above, with lead cable, contact with the continuous lead sheath is relatively easily achieved and removal of a lead plug permits probe contact with the screen layer. With concentric-wire-shield cables, to contact the shield wire one must probe in the outer plastic insulation, and find the shield wires without damage to the mechanical or electrical integrity of the primary insulation. Good contact must be obtained between a shield wire and at least one probe as well as between the screen layer and another probe to establish a test circuit. Finally, the port that is opened to gain access to the cable interior must be recloseable in some relatively simple way, which restores the watertight integrity of the outer jacket. All this must be accomplished safely, quickly, reliably, and without taking the cable out of service.

The primary object of the present invention is achieving improvement of techniques and equipment for the safe and accurate determination of the energization status of cables.

Other objects are to assure that under no circumstances will a false negative on cable energization status be given, despite the number of events which could cause false negative to appear. The electronics employed must detect and infallibly report any problem rather than give an erroneous or misleading reading of cable status.

Also, the electronics should have the capacity to adapt itself to wide ranges of resistivity of the screen layer and should self-test and cable-test on a continuous recycling basis to assure that the cable is dead at the precise time it is actually cut.

Finally, the apparatus must be portable, rugged and weather-resistant to survive truck travel, inclement weather, and dripping manholes.

GENERAL DESCRIPTION OF INVENTION

Broadly, the invention involves an instrument which may be remotely controlled for actuating a cable sheath penetrator which includes probes which are radially movable to contact the screen layer and shield of the cable. The penetrator is combined with electronics which utilize narrow-band AC signals and resistance measurements for self-test and cable-test functions. In the case of lead-sheathed cable, probe contact is had with the sheath and with the screen layer through the opening left by removal of a lead plug. In the case of plastic-sheathed concentric-wire-shield cable, a microprocessor is used to control cycles of probe-heating and probe drive through the plastic sheath to the neutral wire and the screen layer.

For a better understanding of the invention, reference should be made to the description of preferred embodiments which follows, and is to be read with reference to the appended drawings in which.

DESCRIPTION OF PREFERRED EMBODIMENT

Figure 1:
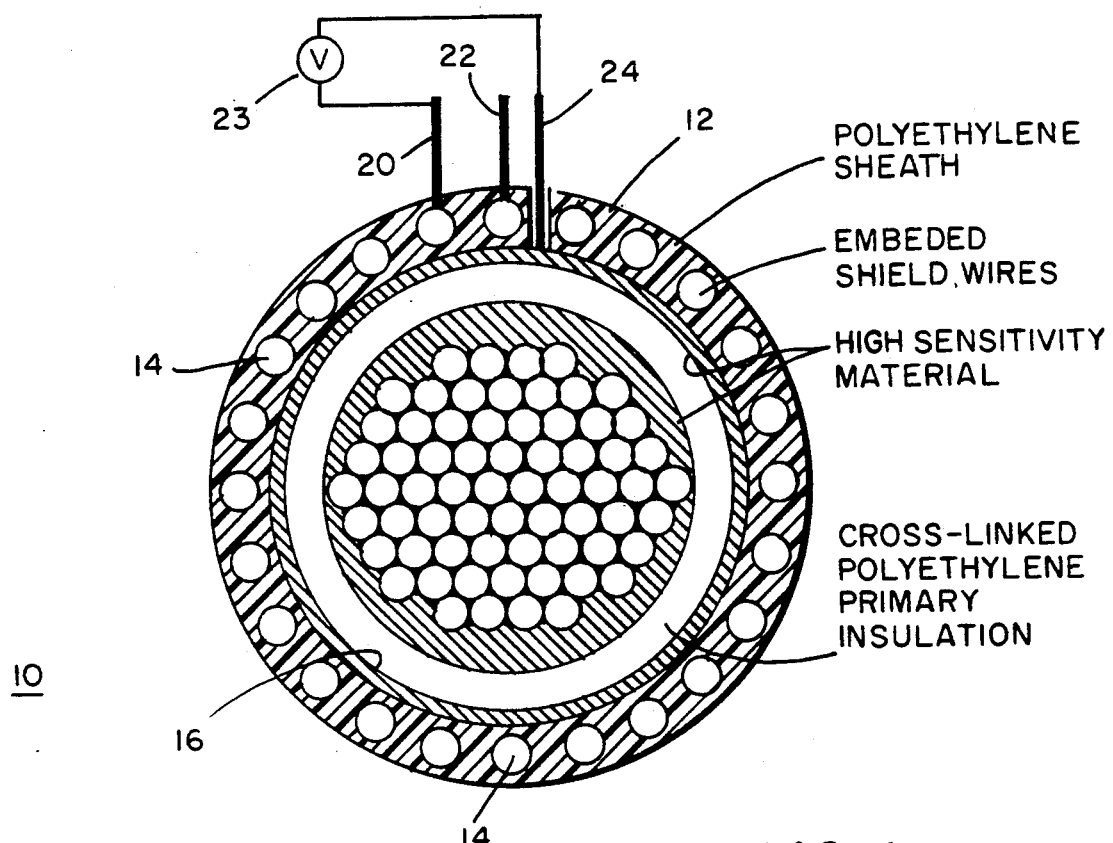
FIG. 1 is a schematic cross-sectional view of a plastic-sheathed concentric-wire-shield cable and probes.
Figure 2A:
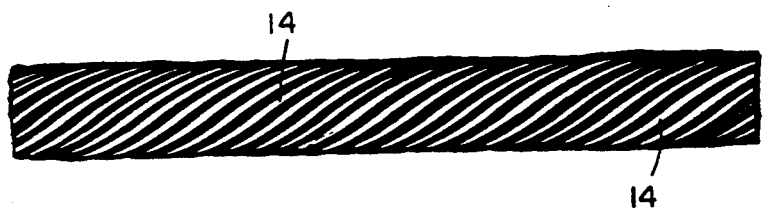
FIGS. 2A-2D illustrate the disposition of shield wires in concentric-wire-shield cables, the wires being concealed within an opaque and hard plastic layer in actual cables.
Figure 2B:
Figure 2C:
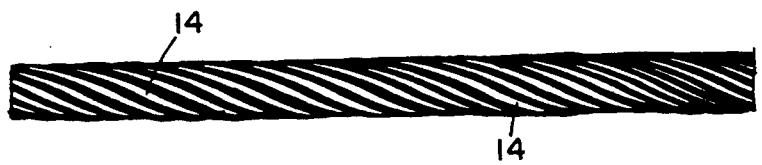
Figure 2D:
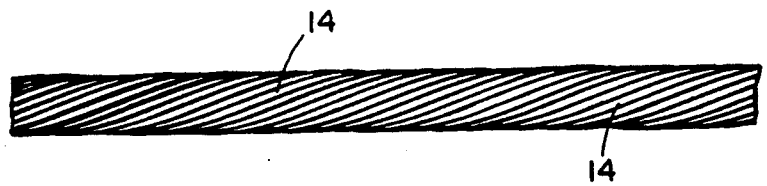

In FIG. 1, the cross-sectional view of the cable 10 shows a plastic sheath 12 which may be composed of any of several plastics, but is preferably polyethylene. Embedded in the sheath 12 are neutral shield wires 14 which terminate to a common junction. The neutral shield wires may be configured in any of several ways. Spacing between shield wires 14 may be regular or irregular, narrow or wide, and the helical winding may be left-handed or right-handed. FIGS. 2(a)–2(d) illustrate cables manufactured by different suppliers, the plastic sheaths being removed to better display the disposition of shield wires.

In typical distribution cables, copper or aluminum conductors which may be of #2 AWG size with insulation of 175 to 220 mils containing neutral wire from #14 AWG to #10 AWG are common, as are lay angles in the range of 18° to 22° to the center line. Shown schematically at the top of FIG. 1 are three probes, 20, 22, and 24. The probes 20 and 22 are shown making contact with shield wires 14 and the probe 24 is shown making contact with the screen layer 16. Establishment of a circuit between the shield wires 14 and the screen layer 16 by the probes 20 and 24, respectively, is symbolized by the element 23 shown in series circuit with the probes.

Figure 3:
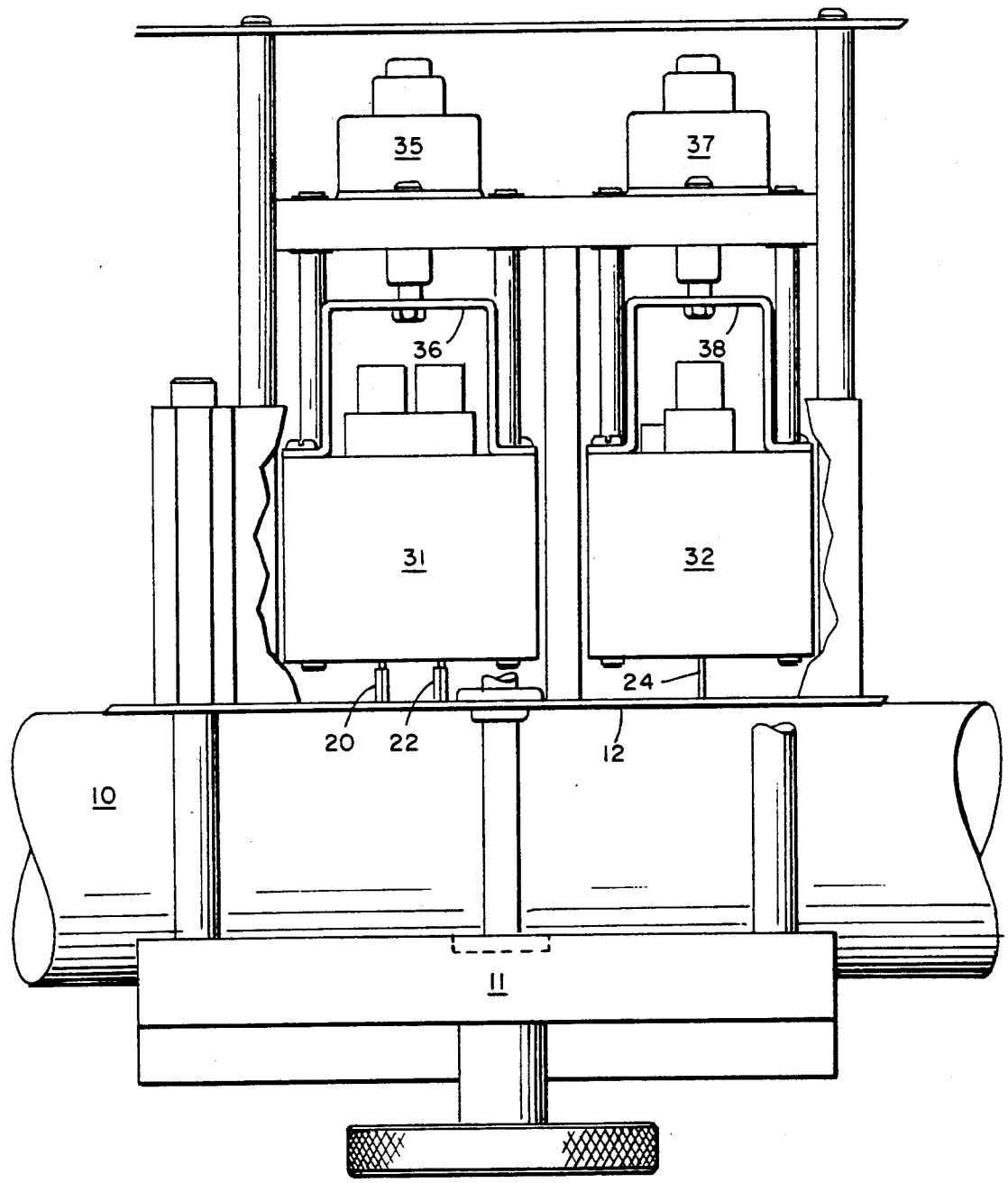
FIG. 3 shows some detail on the structure and disposition of the penetrator and probes.

In FIG. 3, there is shown a cable 10 held in a clamp 11 beneath a penetrator arranged to drive the probes 20, 22 and 24 inwardly through the plastic sheath 12 of the cable 10. The penetrator includes heaters for the three probes which are arranged in a line along the axis of the cable. The probes 20 and 22 having relatively broad blade-like tips are spaced from a needle-pointed probe 24. The probes 20 and 22 are wide enough, typically as wide as one-half inch, to assure contact being made with at least one shield wire irrespective of the spacing or direction of winding of such wires and the needle-pointed probe may be of about 0.031" in diameter, which is less than the smallest spacing between wires.

The heated probes are electrically isolated from each other but are mounted in blocks 31 and 32 from which they protrude under spring pressure. Linear actuators 35 and 37 having shafts connected to brackets 36 and 38 operate to advance the blocks in extremely fine increments as minute as one-thousandth of an inch (0.001"). After each advance, a relatively high frequency signal is injected and the voltage between the probes 20 and 22 is checked. When both probes have encountered shield wires, they advance no further. The needle-pointed probe 24 is similarly checked after each advance by injecting a high frequency signal and checking the resistance between it and the probe. If the probe 24 touches a shield wire, it is retracted and moved laterally transverse to the cable axis by a third linear actuator in sewing-machine style to try again. The needle probe 24 when it passes between the shield wires travels radially inwardly until it encounters the screen layer 16 (FIG. 1) which is indicated by the detection of a resistive path for the applied high frequency signal.

Beyond the screen layer 16 is a relatively thick layer of primary insulation composed of hard, high-melting point plastic, such as translucent cross-linked polyethylene. This layer of primary insulation is substantially unaffected by the heated probe, and damage to it or the screen layer 16 is prevented by stopping the stepping motor and shutting off the heaters as soon as the needle-pointed probe makes electrical contact with the screen layer 16.

Figure 4:
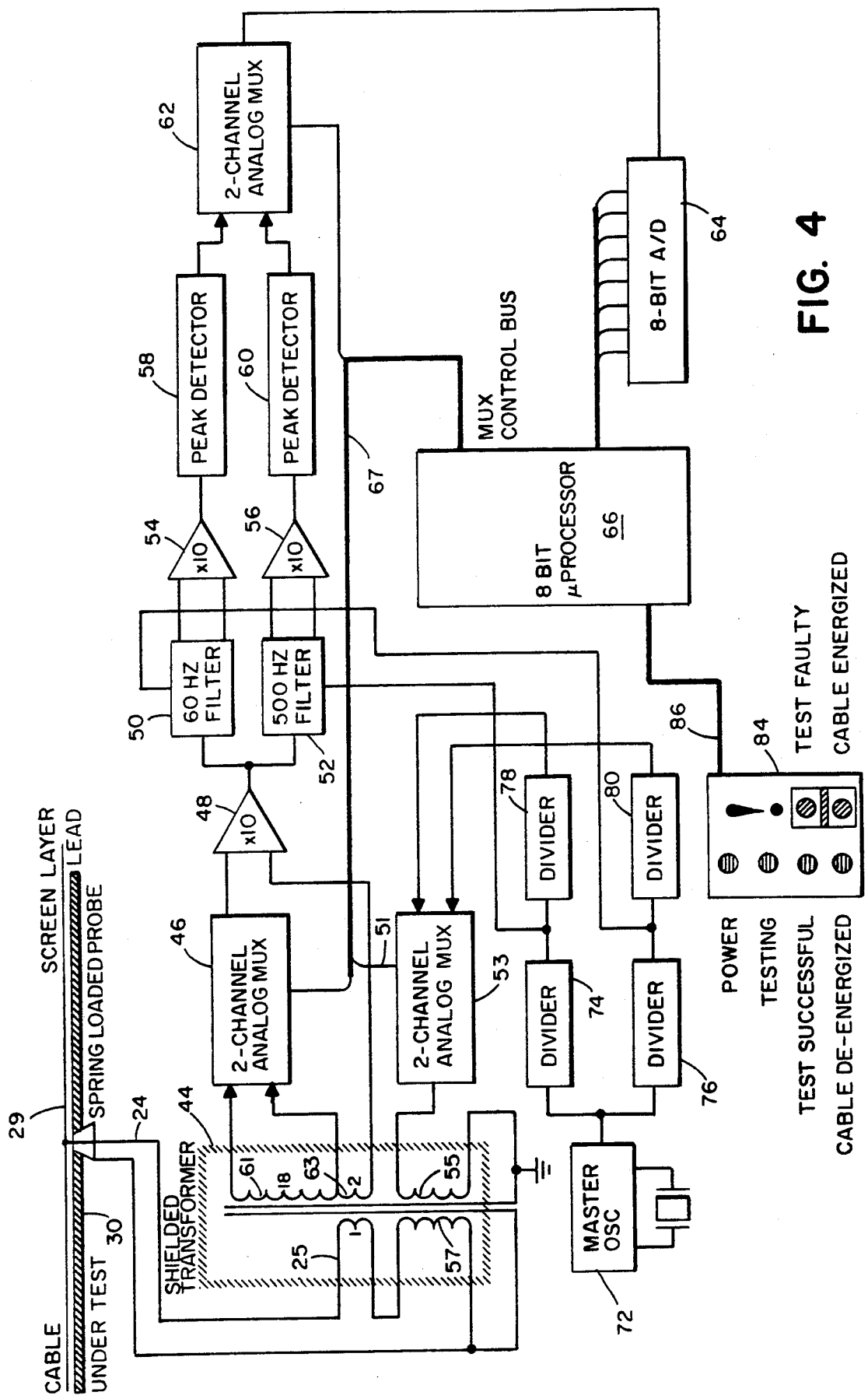
FIG. 4 is a block diagram of the electronics of the system as applied to lead-sheathed cable.

FIG. 4 is a block diagram of an embodiment of the invention as utilized with lead-sheathed cable. The lead sheath 30 is shown as having had a plug of lead removed in the fashion described in U.S. Pat. No. 4,760,327 to expose the screen layer 29. Hence, the heating and selective advancing of probes is not necessary. However, the illustrated narrow-band AC electronic system is used with the lead-sheathed as well as the plastic-sheathed cable to avoid the noise problems associated with DC systems, to permit a wide range of resistivities of the cable screen layer to be accommodated, and to provide generally superior performance.

By suitably dividing and subdividing its output, a single crystal-controlled master oscillator 72 is made to serve as the source of all critical-frequency signals. Dividers 74 and 76 provide precise signals to switched-capacitor filters 52 and 50 and to the multiplexer 53.

The probe 24 is connected to the high side of an input winding 25 of a shielded transformer 44 and returned through a second winding 57 to a neutral conductor which in this case is the lead sheath 30. Series-connected output windings 61 and 63 are provided for a relatively high and a 60 Hz signal and are connected to a 2-channel analog multiplexer 46. The multiplexer 46 under control of a microprocessor 66 via the control bus 67 selectively applies the output of the transformer 44 to a high-gain narrow-band amplifier 48. The 60 Hz output of the amplifier 48 is filtered in the switched-capacitor filter 50 and the higher frequency signal, which may be a 600 Hz signal, is filtered in the switched-capacitor filter 52. The outputs of the two filters are separately amplified in the amplifiers 54 and 56 and passed to peak detectors 58 and 60 respectively. The outputs of the peak detectors 58 and 60 are applied to yet another two-channel analog multiplexer 62 similar to the multiplexer 46 and also controlled by the microprocessor 66. Its output is fed to an analog-to-digital converter 64 and the output of the converter 64 is processed by the microprocessor 66 and relayed to a remote display 84 via a fiber-optic link 86.

The microprocessor 66 also controls the injection of signals into the probe 24 via a line 51 connecting the control bus 67 to the multiplexer 53. Dividers 78 and 80 connected to dividers 74 and 76 respectively convey the 600 Hz and 60 Hz signals to the 2-channel multiplexer 53, the output of which is applied to a primary input winding 55 of the transformer 44. The secondary output winding 57 is in series with the input winding 25 to which the probe 24 is connected.

In operation, after the instrument is clamped in place on a cable, a programmed sequence of operations is commanded by the microprocessor. First, with no inputs the system is checked to make certain there is no conductivity between probes and no signal on the probes. Then, the oscillators are turned on and off, and if there is no continuity between the upper and lower windings of the transformer 44 such as would exist if the probe were in contact with the resistive screen layer 29, there will be no output signal.

With the oscillators continuing to operate, the probe 24 is advanced manually or otherwise through the opening in the sheath 30 to contact the screen layer 29.

Both the 600 Hz and the 60 Hz signals will be detected if there is contact between the probe and the screen layer 29. The signals will also be detected, though, if a short exists between the screen layer 29 and the lead sheath 30, as might occur if a piece of lead from the sheath connects the sheath with the probe 24. To be certain that the contact is not a short and only a low resistance path exists, a low resistance shunt is placed across the input winding 55, and it is then possible to distinguish between a short and the desired resistive contact with the screen layer 29. The microprocessor actually places a resistance comparable in value to that encountered between the sheath and the screen layer across the input winding 55. If a relatively high voltage is then detected and registered by the analog-to-digital converter 64, a short exists or the tester is not operating properly. Conversely, if there is relatively little current flowing and a relatively low voltage is detected, there is the desired contact with the screen layer and the test proceeds.

Next, the oscillators are turned off and the cable is checked again for the presence of a 60 Hz signal. If one is found, it must be emanating from the cable and the cable is not dead. If no 60 Hz signal is found, as a further check on the tester, a 60 Hz signal is injected via the multiplexer 53 and it is made certain that the injected signal is detected, thus guaranteeing that the tester is operating properly.

Figure 5:
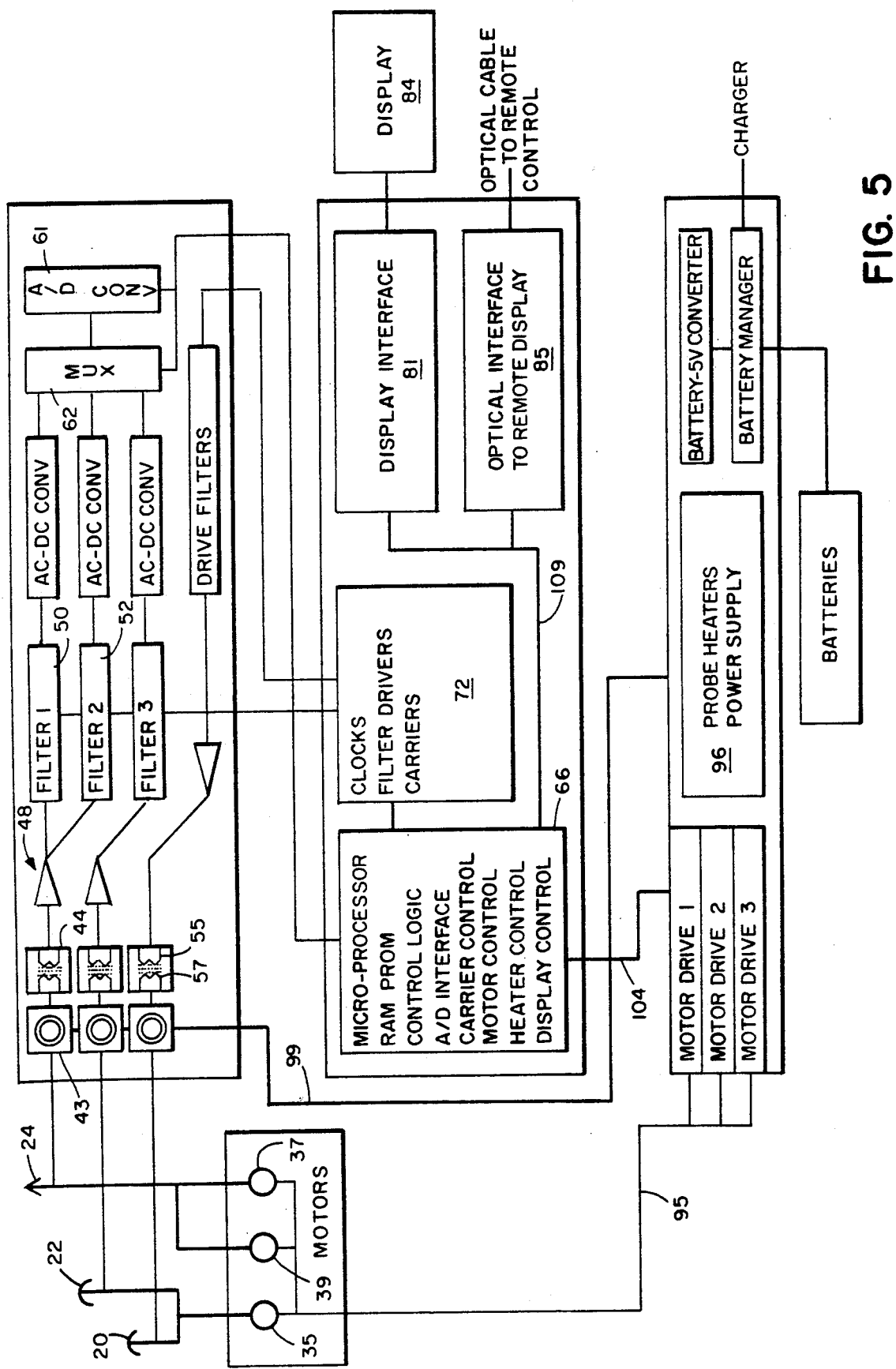
FIG. 5 is a block diagram of the electronics of the system as applied to plastic sheathed concentric-wire-shield cables.

The technique with plastic-sheathed cable is similar but necessarily more complicated as may be appreciated by reference to FIG. 5. FIG. 5 illustrates schematically basic elements and logic of the invention as applied to plastic-sheathed cable. At the upper left, the two wide probes 20 and 22 and the needle-pointed probe 24 are visible. The linear actuator or motor 35 which drives the wide probes 20 and 22 radially into the cable is shown linked mechanically to those probes. A second motor 37 which drives the needle-pointed probe 24 into the cable and a third motor 39 which moves the needle-pointed probe transversely to the axis of the cable are shown linked to the probe 24. Electrical connection to the three motors is indicated by the line 95 which connects the motors to three individual motor drives. Probe heater power supply battery 96 supplies heat to the probes as indicated at 43 via a line 99. The block 66, which may represent a 8032-type microprocessor, incorporates a number of logic elements including a random access memory; a programmable read-only memory; control logic; analog-to-digital interface; carrier control; motor control; heater control; and display control. Input to the microprocessor 66 is derived from the block 72 which includes clocks, filter drivers, and carriers. The needle-pointed probe 24 is connected through the winding of the shielded transformer 44 to the multiplexer 48, the output of which is amplified and filtered into its 60 Hz and 600 Hz components in the filters 50 and 52 respectively.

The microprocessor 66 controls the motors via the line 104 and controls the multiplexer 62 and analog-to-digital converter 64 via the line 106. It also controls the introduction of the test resistance, the display interface 81 for the display 84 and the optical interface 83 for a remote display via the line 109.

Operation of this embodiment of the invention is initiated by heating the probes and moving them radially toward and into the clamped cable in small increments, tests being made after each incremental move first to determine if the outer probes are touching the shield wires. This is done by injecting a 600 Hz signal and checking the voltage between the two broad probes 20 and 22. Stepping the motors and testing continues until continuity indicates that the two probes touch shield wires.

Next, the resistance between the needle-pointed probe 24 and the broad probes 20 and 22 is monitored as the probe 24 is advanced incrementally. A short circuit indicates the needle probe has touched a shield wire, in which case it is retracted and moved slightly transverse to the axis of the cable. The needle probe 24 is then heated and reinserted. The cycle of incremental advance and checking resistance is repeated until the probe passes between shield wires and reaches the conductive layer. Such contact is indicated by a few thousand ohms of resistance—not a short and not an open circuit, and this may be checked as in the case of the lead cable by comparison testing with a shunt resistance across the input to the winding 55.

As in the case of the lead-sheathed cable, the oscillators are turned off and the cable is checked again for the presence of a 60 Hz signal at the probes. If none is present, the cable is presumed dead, but the further step of testing the tester is taken by injecting a 60 Hz signal and detecting it before the cable is severed.

The openings in the plastic sheath may be sealed by dripping melted polyethylene into the openings or simply melting the polyethylene around the opening with a suitable tool such as a gas-fired soldering iron and smoothing the surface with a knife blade.

What has been disclosed are preferred methods and apparatus for cable identification and cable-energization-status determination. The basic steps of testing the tester; testing the cable; and confirming the validity of the test and the proper operability of the tester on a continuous cyclical basis before and up to the instant of contacting the live internal cable conductor are believed to be novel in their application to lead-sheathed cable, concentric-wire-shield cable, and other cables having screen and neutral layers capable of being contacted by probes. The claims of this application should be limited only in accordance with the foregoing.

What is claimed is:

1. The method of identifying and determining the energization status of a cable operable at a given frequency and having a conductive neutral member and an internal resistive screen layer which comprises the steps of:

contacting said neutral member with at least a first probe;

advancing a second probe in increments into said cable;

injecting a test signal differing in frequency from said given frequency across said probes after each incremental advance;

measuring the circuit resistance between said probes with a monitor after each incremental advance;

discontinuing the advance of said second probe upon contact thereof with said screen layer evidenced by said circuit resistance falling within a predetermined range of values;

inserting in parallel with said circuit resistance a shunt resistance of value similar to that of said circuit resistance;

measuring the flow of current through said probes with said shunt resistance in place;

discontinuing the injection of said test signal and disconnecting said shunt resistance upon observation of a predetermined flow of said current;

injecting a signal of said given frequency across said probes; and confirming the presence of said signal of said given frequency at said monitor during the injection thereof.

2. The method defined in claim 1 wherein said neutral member comprises a conductive shield about the periphery of said cable and said step of advancing said second probe into said cable includes passing said second probe through said conductive shield without electrical contact therewith.

3. The method defined in claim 2 wherein said conductive shield has at least an opening formed therein and said step of advancing said second probe includes passing said second probe through said opening.

4. The method defined in claim 2 wherein said conductive shield is comprised of spaced conductive elements encased in plastic material and the step of advancing said probes includes the heating of said probes above the melting point of said plastic material.

5. The method defined in claim 4 which includes the steps of providing a first probe having a leading edge of width greater than the spacing between said conductive elements and providing a second probe of thickness less than the spacing between said conductive elements.

6. The method of identifying and determining the energization status of a cable operable at a given frequency and having a conductive neutral shield member and a resistive screen layer disposed internally of said shield member which comprises the steps of:

contacting said neutral shield member with a first probe;

advancing a second probe through said shield member in increments toward said screen layer;

measuring the alternating current resistance between said probes at a frequency higher than said given frequency after each incremental advance of said second probe;

discontinuing the advance of said second probe upon measurement of a predetermined resistance between said probes; and removing said probes from said cable.

7. An instrument for identifying and determining the energization status of a power distribution cable operable at a given frequency having a conductive neutral shield member and an internal resistive screen layer comprising:

a first probe means for contacting said neutral shield member;

a second probe disposed radially external of said cable;

means for advancing said second probe toward said screen layer in increments;

means for checking the alternating current resistance at a second frequency differing from said given frequency between said first probe and said second probe after each incremental advance of said second probe means;

means for discontinuing the advancing of said second probe upon contact thereof with said screen layer as indicated by detection of said alternating current resistance at a predetermined value; and a microprocessor for controlling all said previously mentioned means.

8. An instrument as defined in claim 7 and further including a self-tester for said instrument comprising:

a source of a signal of said given frequency;

means controlled by said microprocessor for injecting said signal as an input in circuit with said probes; and means for detecting the presence or absence of said signal as an output in circuit with said probe.

9. An instrument as defined in claim 7 wherein said neutral shield member comprises spaced conductors electrically connected together, said first probe comprises a pair of elements each having a leading edge wider than the spacing between said conductors and said second probe comprises an element of thickness less than the spacing between said conductors.

10. An instrument as defined in claim 7 wherein said cable includes a plastic sheath, said instrument further comprising:

heaters for each of said probes for raising the temperature thereof above the melting point of said plastic sheath; and means controlled by said microprocessor for energizing said heaters prior to each incremental advance thereof.

11. An instrument as defined in claim 7 and further including means for retracting said second probe upon the occurrence of electrical contact between said second probe and said neutral shield member, means for moving said second probe relative to said cable after retraction therefrom, and means for again advancing said second probe toward said screen layer, said retracting means, said moving means and said means for again advancing said second probe being controlled by said microprocessor.

12. An instrument as defined in claim 7 and further including means controlled by said microprocessor for connecting a resistance in shunt with the resistance between said probes after said second probe contacts said screen layer.

* * * * *